United States Patent
Huang

(10) Patent No.: US 9,551,742 B2
(45) Date of Patent: Jan. 24, 2017

(54) CIRCUIT AND METHOD FOR OVERCURRENT DETECTION OF POWER SWITCH

(71) Applicant: Fairchild Semiconductor Corporation, San Jose, CA (US)

(72) Inventor: Lei Huang, Beijing (CN)

(73) Assignee: FAIRCHILD SEMICONDUCTOR CORPORATION, San Jose, CA (US)

(*) Notice: Subject to any disclaimer, the term of this patent is extended or adjusted under 35 U.S.C. 154(b) by 286 days.

(21) Appl. No.: 13/936,331

(22) Filed: Jul. 8, 2013

(65) Prior Publication Data

US 2014/0021979 A1 Jan. 23, 2014

(30) Foreign Application Priority Data

Jul. 19, 2012 (CN) .......................... 2012 1 0256237

(51) Int. Cl.
| | | |
|---|---|---|
| G01R 31/26 | (2014.01) | |
| H03K 17/082 | (2006.01) | |
| H01L 27/02 | (2006.01) | |
| G01R 19/165 | (2006.01) | |

(52) U.S. Cl.
CPC ....... *G01R 31/2621* (2013.01); *H01L 27/0285* (2013.01); *H03K 17/0822* (2013.01); *G01R 19/16519* (2013.01)

(58) Field of Classification Search
None
See application file for complete search history.

(56) References Cited

U.S. PATENT DOCUMENTS

2004/0207967 A1* 10/2004 Ohshima ............ H03K 17/0822
361/93.1

FOREIGN PATENT DOCUMENTS

| CN | 1866035 A | 11/2006 |
|---|---|---|
| CN | 102208802 A | 10/2011 |
| CN | 202133708 U | 2/2012 |
| CN | 202142836 U | 2/2012 |
| CN | 202794314 U | 3/2013 |
| EP | 0512920 A2 | 11/1992 |
| JP | H0552880 A | 3/1993 |

OTHER PUBLICATIONS

"Chinese Application Serial No. 201210256237.7, Office Action mailed Jul. 22, 2015", w/ English Claims, 9 pgs.

* cited by examiner

*Primary Examiner* — Paresh Patel
(74) *Attorney, Agent, or Firm* — Schwegman Lundberg & Woessner, P.A.

(57) ABSTRACT

An overcurrent detection circuit for a power switch comprises a sampling circuit and a comparing circuit. The sampling circuit is configured to perform current sampling on the power switch using a sampling Metal-Oxide-Semiconductor Field-Effect Transistor (MOSFET) and an amplifier, convert a sample current into a sample voltage and transmit the sample voltage to the comparing circuit, and clamp operating voltages of the comparing circuit and of an output circuit of the amplifier by a serially connected clamping MOSFET. The comparing circuit is configured to compare the sample voltage with a reference voltage and to output a result of overcurrent detection.

16 Claims, 3 Drawing Sheets

CIRCUIT AND METHOD FOR OVERCURRENT DETECTION OF POWER SWITCH

CLAIM OF PRIORITY

This application claims the benefit of priority to People's Republic of China Patent Application Serial No. 201210256237.7, filed Jul. 19, 2012.

BACKGROUND

The on and off properties of a power switch, namely, a power Metal-Oxide-Semiconductor Field-Effect Transistor (MOSFET), is often used to implement efficient conversion of signals and energy in a switch power supply, a switch amplifier, a charge pump, and the like. Typically, a large current passes through a power MOSFET when the power MOSFET is on, and if the current passing through the power MOSFET exceeds the tolerance of the power MOSFET, the power MOSFET may be damaged permanently. Therefore, in order to ensure the reliability of the power MOSFET, continuous detection may be performed on the current passing through the power MOSFET, and overcurrent protection over the power MOSFET may be performed when the passing current is too large.

FIG. 1 gives an overcurrent detection circuit for the case in which an N-type MOSFET (NMOS) serves as the power switch. As shown in FIG. 1, NMOS N1 as a power switch has a ratio of N:1 in size over NMOS N2, and is in common-gate and common-drain connection with NMOS N2, with both gates connected to a first bias voltage CP1, and both drains connected to an input voltage Vin. The source of NMOS N1 is connected to the negative input of an amplifier A1, and the source of NMOS N2 is connected to the positive input of the amplifier A1 and the drain of an NMOS N3. The output of the amplifier A1 is connected to the gate of NMOS N3, which is in common-gate and common-source connection with an NMOS N4, with both sources connected to ground. The drain of NMOS N4 is connected to a resistor R1 and the negative input of a comparator OP1. One end of resistor R1 is connected to the drain of NMOS N4, and the other end of resistor R1 is connected to voltage Vin. One end of a resistor R2 is connected to the positive input of comparator OP1 and a reference current source Q1, and the other end of R2 is connected to input voltage Vin. The power terminal of comparator OP1 is connected to input voltage Vin, and comparator OP1 generates an output signal OCP.

During the operation of the overcurrent detection circuit shown in FIG. 1, as amplifier A1 is in negative feedback connection, the virtual shorting effect of amplifier A1 equalizes the voltages at the positive and negative inputs of the amplifier A1. NMOS N2 samples the current passing through NMOS N1, which is N times of the current passing through NMOS N2, where N is a positive integer. The current passing through NMOS N3 is that through NMOS N2. NMOS N4 mirrors the current in NMOS N3, resulting in a current Is passing through NMOS N4. The voltage drop across resistor R1 is R1*Is, the voltage drop across resistor R2 is R2*Ir, where Ir indicates the current supplied by reference current source Q1. When the current passing through NMOS N1 is small, the current passing through NMOS N2 is also small and R1*Is<R2Ir. The output signal OCP of comparator OP1 is low or inactive in this case; indicating no overcurrent in NMOS N1. When the current passing through NMOS N1 reaches an overcurrent protection threshold, or R1*Is>R2Ir, the output signal OCP of comparator OP1 is high or active; indicating that an overcurrent has occurred in NMOS N1.

There are some drawbacks to the circuit of FIG. 1. In the overcurrent detection circuit shown in FIG. 1, input voltage Vin is typically has a high voltage value, and thus each device in the circuit has to be able to tolerate higher voltages. Additionally, there will be a large error in the current Is passing through NMOS N4 obtained by current mirroring; reducing the accuracy of overcurrent detection.

Further, the amplifier A1 in FIG. 1 has a structure typically as shown in FIG. 2. The gate of NMOS N21 is the negative input, the source of NMOS N21 is connected to the source of NMOS N22, and to the ground via a current source Q21, and the drain of NMOS N21 is connected to the drain of and the gate of a P-type MOSFET (PMOS) P21, and to the gate of PMOS P22. PMOS P21 and PMOS P22 are in common-source and common-gate connection, forming a current mirroring circuit. The gate of NMOS N22 is the positive input of the amplifier, the drain of NMOS N22 is connected to that of PMOS P22 and the gate of PMOS P23. The drain of PMOS P23 is the output, and is connected to ground via current source Q22. When voltages at the positive and negative inputs of the amplifier shown in FIG. 2 are close or equal to the supply voltage, the voltages at the drain and the source of NMOS N21 are very close to each other, making NMOS N21 operate in a linear region, thereby reducing the gain of the amplifier.

OVERVIEW

In order to solve the problems in the prior art, the disclosure provides a circuit and a method for overcurrent detection of a power switch.

A circuit example includes a sampling circuit and a comparing circuit. The sampling circuit is configured to perform current sampling on the power switch using a sampling Metal-Oxide-Semiconductor Field-Effect Transistor (MOSFET) and an amplifier, convert a sample current into a sample voltage and transmit the sample voltage to the comparing circuit, and clamp operating voltages of the comparing circuit and of an output circuit of the amplifier by a serially connected clamping MOSFET. The comparing circuit is configured to compare the sample voltage with a reference voltage and output the result of overcurrent detection.

A method example includes performing, by a sampling circuit, current sampling on the power switch using a sampling MOSFET and an amplifier, converting, by the sampling circuit, a sample current into a sample voltage and transmitting, by the sampling circuit, the sample voltage to a comparing circuit, and clamping, by a serially connected clamping MOSFET, operating voltages of the comparing circuit and of an output circuit of the amplifier; and comparing, by the comparing circuit, the sample voltage with a reference voltage and outputting, by the comparing circuit, the result of overcurrent detection.

With the circuit and method for overcurrent detection of a power switch provided by the disclosure, the sampling circuit of the overcurrent detection circuit performs current sampling on the power switch using a sampling MOSFET and an amplifier, converts a sample current into a sample voltage and transmits the sample voltage to the comparing circuit, and clamps operating voltages of the comparing circuit and of an output circuit of the amplifier by a serially connected clamping MOSFET. The comparing circuit compares the sample voltage with a reference voltage and outputs the result of overcurrent detection. Thus, overcurrent detection of a power switch can be implemented, enabling both the comparing circuit and the output circuit of the amplifier in the sampling circuit to be formed with low voltage devices.

The amplifier of the disclosure also has a structure in which the source of a PMOS of a current mirror serves as an input, and the gate voltage of an NMOS at the output is clamped by the PMOS, such that the gain of the amplifier may be increased effectively.

This section is intended to provide an overview of subject matter of the present patent application. It is not intended to provide an exclusive or exhaustive explanation of the invention. The detailed description is included to provide further information about the present patent application.

DETAILED DESCRIPTION

Figure 3:
FIG. 3 is a block diagram of an example of an overcurrent detection circuit for a power switch in accordance with some embodiments.

This document discloses devices and methods for overcurrent detection for a power switch. Fig. shows a block diagram of an example of an overcurrent detection circuit. As shown in FIG. 3, the overcurrent detection circuit for a power switch includes a sampling circuit 10 and a comparing circuit 11. The sampling circuit 10 is configured to perform current sampling on the power switch using a sampling MOSFET and an amplifier, convert a sample current into a sample voltage and transmit the sample voltage to the comparing circuit 11, and clamp operating voltages of the comparing circuit 11 and of an output circuit of the amplifier by a serially connected clamping MOSFET. The comparing circuit 11 is configured to compare the sample voltage with a reference voltage and output the result of overcurrent detection. The power switch may be an NMOS or a PMOS. The clamping MOSFET can be an NMOS.

Figure 4:
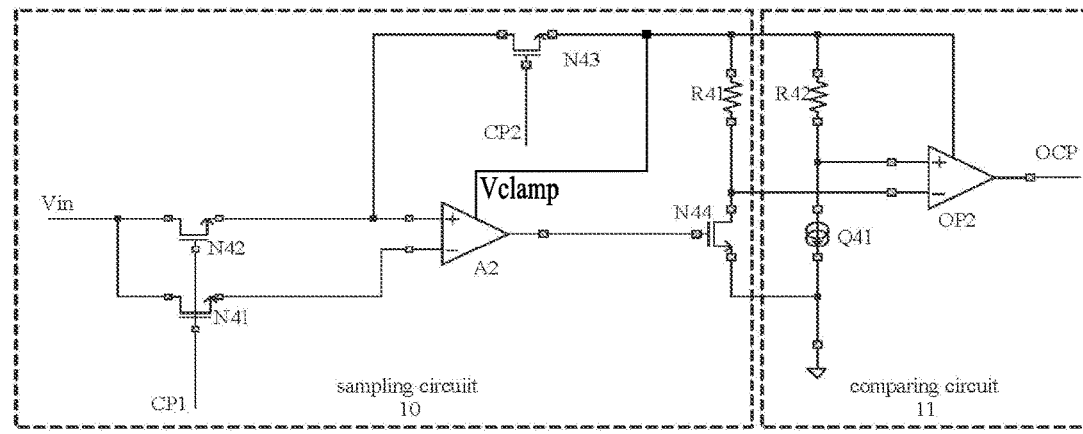
FIG. 4 is a schematic view of an example of an overcurrent detection circuit for a power switch in accordance with some embodiments.

FIG. 4 shows a schematic diagram of an example of an overcurrent detection circuit. The circuit provides overcurrent detection for a power switch N41 and includes a sampling circuit 10 and a comparing circuit 11. The sampling circuit 10 includes a sampling MOSFET N42, an amplifier A2, a clamping MOSFET N43, a negative feedback controlling MOSFET N44, and a divider resistor R41. The sampling MOSFET N42 and the power switch N41 are in common-gate and common-drain connection, with both gates connected to a first bias voltage CP1, and both drains to an input voltage Vin. The source of sampling MOSFET N42 is connected to a positive input of amplifier A2 and the drain of clamping MOSFET N43. The source of the power switch N41 is connected to a negative input of amplifier A2. The output of amplifier A2 is connected to the gate of the negative feedback controlling MOSFET N44. The gate of clamping MOSFET N43 is connected to a second bias voltage CP2, and the source of clamping MOSFET N43 is connected to the divider resistor R41. One end of the divider resistor R41 is connected to the source of clamping MOSFET N43, the power terminal of a comparator OP2, and a reference resistor R42 in the comparing circuit. The other end of the divider resistor R41 is connected to the drain of the negative feedback controlling MOSFET N44 and the negative input of the comparator OP2 in the comparing circuit. The source of the negative feedback controlling MOSFET N44 is connected to ground.

The comparing circuit 11 includes reference resistor R42, a reference current source Q41, and comparator OP2. The common end of the reference resistor R42 and the reference current source Q41 is connected to the positive input of the comparator OP2. The power switch N41 has a ratio of N:1 in size over the sampling MOSFET N42, where N is a positive integer.

During the operation of the overcurrent detection circuit shown in FIG. 4, amplifier A2 is connected in a negative feedback configuration. A virtual shorting effect at the input terminals of amplifier A2 equalizes voltages at the positive and negative inputs of amplifier A2. The sampling MOSFET N42 samples the current passing through the power switch N41, which is N times the current passing through sampling MOSFET N42. The current passing through the sampling MOSFET N42 Is is the current passing through clamping MOSFET N43, the negative feedback controlling MOSFET N44, and the divider resistor R41. The voltage drop across the divider resistor R41 is therefore R41*Is.

The voltage drop across the reference resistor R42 is R42*Ir, where Ir is a reference current supplied by the reference current source Q41. The reference voltage Vref input at the positive input of the comparator OP2 is the source voltage Vs of clamping MOSFET N43 minus R42*Ir (or Vs−R42*Ir). The sample voltage Vsam input at the negative input of the comparator OP2 is the source voltage Vs of clamping MOSFET N43 minus R41*Is (or Vs−R41*Is).

When the current passing through power switch N41 is small, the current passing through sampling MOSFET N42 is also small, and R41*Is<R42*Ir. Vsam>Vref and the output signal OCP of the comparator OP2 is low or inactive; indicating no overcurrent in the power switch N41. When the current passing through power switch N41 reaches an overcurrent protection threshold then R41*Is>R42*Ir. Vsam<Vref, and the output signal OCP of the comparator OP2 is high or active; indicating an overcurrent in the power switch N41.

Figure 1:
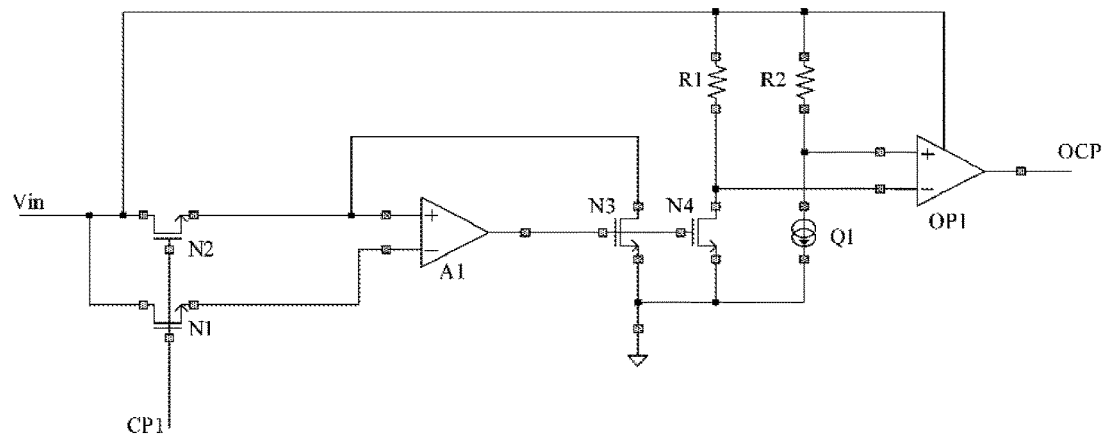
FIG. 1 is a schematic view of an overcurrent detection circuit with an NMOS as a power switch.
Figure 2:
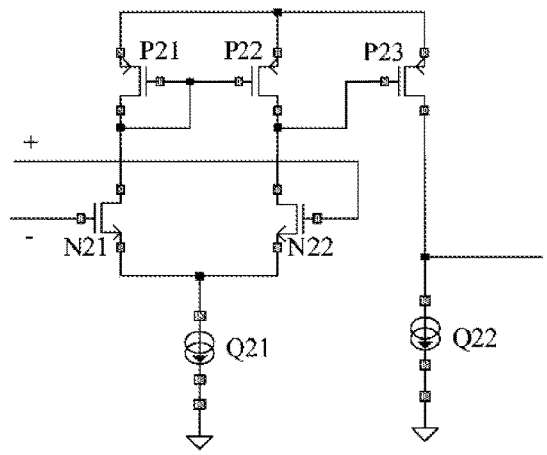
FIG. 2 is a schematic view of the structure of the amplifier A of FIG. 1.

The source voltage Vs of clamping MOSFET N43 is the second bias voltage CP2 minus the gate-source voltage Vgs. The second bias voltage CP2 may be a low voltage much less than the high input voltage Vin. For example CP2 can be 6 V. Therefore both the operating voltage of the comparing circuit and the operating voltage of the output circuit of amplifier A2 that is formed by the negative feedback controlling MOSFET N44 and the divider resistor R41 are lower voltages. Therefore, all of the negative feedback controlling MOSFET N44, divider resistor R41, reference resistor R42, reference current source Q41, and comparator OP2 may be low voltage devices. Thus, the number of high voltage devices is reduced from the circuit shown in FIG. 1.

Figure 5:
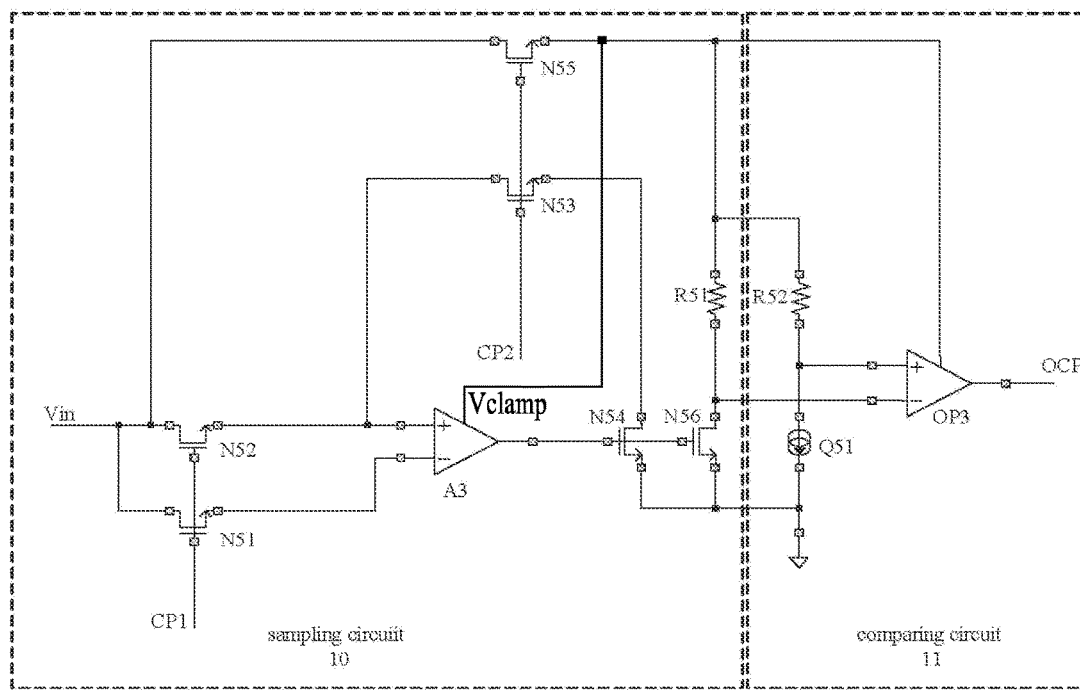
FIG. 5 is a schematic view of an example of another overcurrent detection circuit for a power switch in accordance with some embodiments.

FIG. 5 is a schematic view of another example of an overcurrent detection circuit. The circuit provides overcurrent detection for a power switch N51 and includes a sampling circuit 10 and a comparing circuit 11. The sampling circuit 10 includes sampling MOSFET N52, amplifier A3, a first clamping MOSFET N53, a second clamping MOSFET N55, a negative feedback controlling MOSFET N54, a divider resistor R51, and a mirroring MOSFET N56. Sampling MOSFET N52 and power switch N51 are in common-gate and common-drain connection, with both gates connected to a first bias voltage CP1, and both drains to an input voltage Vin. The source of sampling MOSFET N52 is connected to a positive input of amplifier A3 and the drain of the first clamping MOSFET N53. The source of power switch N51 is connected to a negative input of amplifier A3. The output of amplifier A3 is connected to the gate of the negative feedback controlling MOSFET N54. The gate of the first clamping MOSFET N53 is connected to a second bias voltage CP2, and the source of the first clamping MOSFET N53 is connected to the drain of the negative feedback controlling MOSFET N54. The drain of the second clamping MOSFET N55 is connected to the input voltage Vin, and the gate of the second clamping MOSFET N55 is connected to the second bias voltage CP2. The source of the second clamping MOSFET N55 is connected to the divider resistor R51, the power terminal of comparator OP3 and the reference resistor R52 of the comparing circuit. One end of the divider resistor R51 is connected to the source of the second clamping MOSFET N55, the power terminal of comparator OP3 and reference resistor R52 of the comparing circuit. The other end of the divider resistor R51 is connected to the drain of the mirroring MOSFET N56 and the negative input of comparator OP3 of the comparing circuit. The mirroring MOSFET N56 and the negative feedback controlling MOSFET N54 are in common-source and common-gate connection, with both sources connected to ground.

The comparing circuit 11 includes reference resistor R52, reference current source Q51, and comparator OP3. The common end of reference resistor R52 and reference current source Q51 is connected to the positive input of comparator OP3. The power switch N51 has a ratio of N:1 in size over the sampling MOSFET N52. The power switch N51, sampling MOSFET N52, the first clamping MOSFET N53, the second clamping MOSFET N55, negative feedback controlling MOSFET N54, and mirroring MOSFET N56 are all NMOSs.

During the operation of the overcurrent detection circuit shown in FIG. 5, amplifier A3 is connected in a negative feedback configuration, wherein a virtual shorting effect at the input terminals of amplifier A3 equalizes voltages at the positive and negative inputs of amplifier A3. The sampling MOSFET N52 samples the current passing through power switch N51, and the current passing through sampling MOSFET N52 is 1/N of that through power switch N51. The current passing through the first clamping MOSFET N53 and the negative feedback controlling MOSFET N54 is the current Is passing through sampling MOSFET N52. The mirroring MOSFET N56 mirrors the current Is of the negative feedback controlling MOSFET N54. The voltage drop across the divider resistor R51 is R51*Is, where R51 in the equation represents the resistance of R51 in ohms. The voltage drop across reference resistor R52 is R52*Ir, where R52 in the equation represents the resistance of R52 in ohms and Ir is the reference current supplied by reference current source Q51. The reference voltage Vref at the positive input of comparator OP3 is the source voltage Vs of the second clamping MOSFET N55 minus R52*Ir. The sample voltage Vsam at the negative input of comparator OP3 is the source voltage Vs of the second clamping MOSFET N55 minus R51*Is.

When the current passing through power switch N51 is small, the current passing through sampling MOSFET N52 is also small, and R51*Is<R52*Ir. Vsam>Vref and the output signal OCP of comparator OP3 is low or inactive; indicating no overcurrent in power switch N51. When the current passing through power switch N51 reaches an overcurrent protection threshold, R51*Is>R52*Ir and Vsam<Vref. The output signal OCP of comparator OP3 is high or active; indicating an overcurrent in power switch N51.

The source voltage Vs of both the first clamping MOSFET N53 and the second clamping MOSFET N55 is the second bias voltage CP2 minus the gate-source voltage Vgs. The second bias voltage CP2 may be a low voltage much less than the input voltage Vin, such as for example 6 V. Therefore, the operating voltage of both the comparing circuit and the output circuit of amplifier A3 that is formed by negative feedback controlling MOSFET N54, divider resistor R51, and mirroring MOSFET N56, are low. All of negative feedback controlling MOSFET N54, divider resistor R51, mirroring MOSFET N56, reference resistor R52, reference current source Q51, and comparator OP3 may be low voltage devices.

Figure 6:
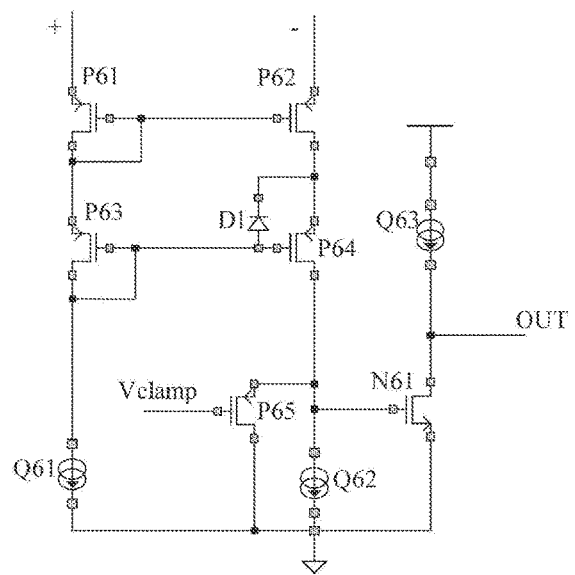
FIG. 6 is a schematic view of an example of the structure of the amplifier in an overcurrent detection circuit in accordance with some embodiments.

Both the aforementioned amplifiers A2 and A3 may have a structure in which the source of a PMOS of a current mirror serves as an input, and the gate voltage of an NMOS at the output is clamped by the PMOS. As shown in FIG. 6, amplifiers A2 and A3 may include a first PMOS P61, a second PMOS P62, a third PMOS P63, a fourth PMOS P64, a fifth PMOS P65, a first reference current source Q61, a second reference current source Q62, a third reference current source Q63, a clamping diode D1, a first NMOS N61.

The first PMOS P61 and the second PMOS P62 form a current mirror stage. The third PMOS P63 and the fourth PMOS P64 form a serial stack type stage for increasing the gain of the amplifier. The source of the first PMOS P61 is the positive input of the amplifier, the gate of the first PMOS P61 is connected to the drain of the first PMOS P61 and to the gate of the second PMOS P62, and the drain of the first PMOS P61 is connected to the source of the third PMOS P63. The source of the second PMOS P62 is the negative input of the amplifier, the drain of the second PMOS P62 is connected to the negative electrode of the clamping diode D1 and the source of the fourth PMOS P64. The gate of the third PMOS P63 is connected to the drain of the third PMOS P63 and to the gate of the fourth PMOS P64, and the drain of the third PMOS P63 is connected to the first reference current source Q61. The gate of the fourth PMOS P64 is also connected to the positive electrode of the clamping diode D1. The drain of the fourth PMOS P64 is connected to the source of the fifth PMOS P65, the second reference current source Q62, and the gate of the first NMOS N61. The gate of the fifth PMOS P65 is connected to a clamping voltage Vclamp and the drain of the fifth PMOS P65 is connected to ground. The source of the first NMOS N61 is connected to ground and the drain of the first NMOS N61 acts as the output of the amplifier and is connected to the third reference current source Q63.

The clamping diode D1 can be configured to clamp the voltage at the node connected to the drain of the second PMOS P62 and the source of the fourth PMOS P64 to ensure that the voltage at that node will not be too low to exceed the allowed operating voltage ranges of the second and the fourth PMOSs P62 and P64. The fifth PMOS P65 is configured to clamp the gate voltage of the first NMOS N61 to protect the gate of the first NMOS N61 from overvoltage.

The aforementioned structure of the serial stack type circuit formed by the third PMOS P63 and the fourth PMOS P64 is illustrative only, and is optional, and does not exclude a serial stack type circuit connection formed in other structures, such as serially connected resistor R61 at the drain of the third PMOS P63, connecting the gate of the first PMOS P61 to that of the second PMOS P62 and the common end of the drain of the third PMOS P63 and resistor R61, and connecting the gate of the third PMOS P63 to another end of resistor R61 and the gate of the fourth PMOS P64.

The disclosure further provides an overcurrent detection method for a power switch. The method includes performing, by a sampling circuit, current sampling on the power switch using a sampling MOSFET and an amplifier, converting, by the sampling circuit, a sample current into a sample voltage and transmitting, by the sampling circuit, the sample voltage to a comparing circuit, and clamping, by a serially connected clamping MOSFET, operating voltages of the comparing circuit and of an output circuit of the amplifier. The method further includes comparing, by the comparing circuit, the sample voltage with a reference voltage and outputting, by the comparing circuit, the result of overcurrent detection.

The power switch may be an NMOS or a PMOS. The clamping MOSFET can be an NMOS. The sampling circuit can include the sampling MOSFET, the amplifier, the clamping MOSFET, a negative feedback controlling MOSFET, and a divider resistor. The clamping MOSFET and the divider resistor can be serially connected on a negative feedback path of the amplifier. The common end of the divider resistor and the negative feedback controlling MOSFET may output a sample voltage.

Alternatively, the sampling circuit can include the sampling MOSFET, the amplifier, a first clamping MOSFET, a second clamping MOSFET, a negative feedback controlling MOSFET, a divider resistor, and a mirroring MOSFET. The first clamping MOSFET can be serially connected on a negative feedback path of the amplifier. The second clamping MOSFET can be serially connected on the operating voltage path of a branch in which the divider resistor and the mirroring MOSFET are located. The mirroring MOSFET mirrors the current on the negative feedback controlling MOSFET, and the common end of the divider resistor and the mirroring MOSFET may output a sample voltage.

The amplifier may have a structure in which the source of a PMOS of a current mirror serves as an input, and the gate voltage of an NMOS at the output is clamped via a PMOS, as shown in FIG. 6. The amplifier may include a first PMOS P61, a second PMOS P62, a third PMOS P63, a fourth PMOS P64, a fifth PMOS P65, a first reference current source Q61, a second reference current source Q62, a third reference current source Q63, a clamping diode D1, a first NMOS N61.

The first PMOS P61 and the second PMOS P62 may form a current mirror stage. The third PMOS P63 and the fourth PMOS P64 may form a serial stack type stage capable of increasing the gain of the amplifier. The source of the first PMOS P61 is the positive input of the amplifier, the gate of the first PMOS P61 is connected to the drain of the first PMOS P61 and to the gate of the second PMOS P62, and the drain of the first PMOS P61 is connected to the source of the third PMOS P63. The source of the second PMOS P62 is the negative input of the amplifier, the drain of the second PMOS P62 is connected to the negative electrode of the clamping diode D1 and the source of the fourth PMOS P64. The gate of the third PMOS P63 is connected to the drain of the third PMOS P63 and to the gate of the fourth PMOS P64, and the drain of the third PMOS P63 is connected to the first reference current source Q61. The gate of the fourth PMOS P64 is also connected to the positive electrode of the clamping diode D1, the drain of the fourth PMOS P64 is connected to the source of the fifth PMOS P65, the second reference current source Q62, and the gate of the first NMOS N61. The gate of the fifth PMOS P65 is connected to a clamping voltage Vclamp, and the drain of the fifth PMOS P65 is connected to ground. The source of the first NMOS N61 is connected to ground. The drain of the first NMOS N61 acts as the output of the amplifier and is connected to the third reference current source Q63.

Figure 7:
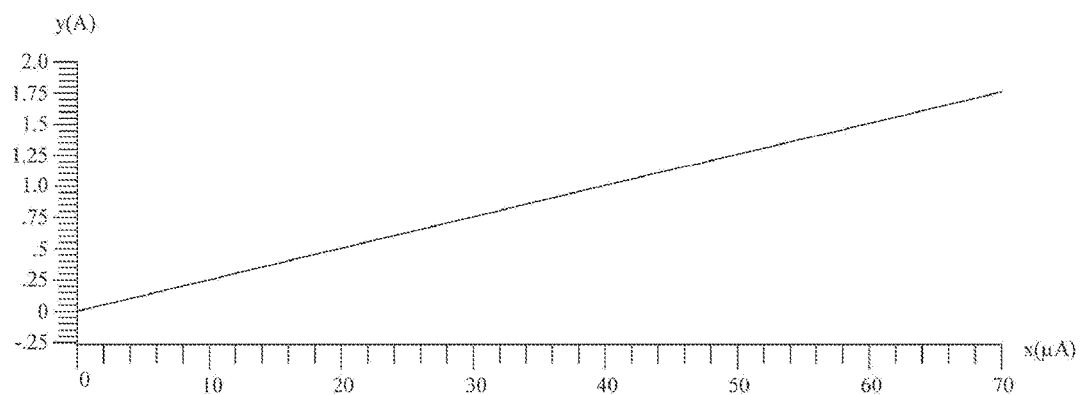
FIG. 7 shows a graph of the relationship between the threshold of power switch overcurrent protection and the reference current in an example of an overcurrent detection circuit in accordance with some embodiments.

The examples provided herein of an improved overcurrent detection circuit for a power switch can adjust the threshold for overcurrent protection of the power switch by adjusting the reference current, as shown in FIG. 7. The x axis represents the reference current, and the y axis represents the threshold for overcurrent protection of the power switch. A linear relation is shown between the threshold for overcurrent protection of the power switch and the reference current.

To summarize, the technical solution of the disclosure can implement overcurrent detection of the power switch, and enable both the comparing circuit and the output circuit of the amplifier in the sampling circuit to be implemented as low voltage devices, and the amplifier has a structure in which the source of a PMOS of a current mirror serves as an input, and the gate voltage of an NMOS at the output is clamped by the PMOS, thereby increasing the gain of the amplifier effectively.

What are described above are merely examples and are not intended to limit the scope of the disclosure. The above description is intended to be illustrative, and not restrictive. The above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An overcurrent detection circuit for a power switch, the overcurrent detection circuit comprising a sampling circuit operatively coupled to the power switch and a comparing circuit operatively coupled to the sampling circuit; wherein the sampling circuit includes:

a sampling Metal-Oxide-Semiconductor Field-Effect Transistor (MOSFET) operatively coupled to the power switch, wherein the sampling MOSFET is configured to sample current in the power switch to generate a sampled current;

an amplifier circuit having inputs operatively coupled to the sampling MOSFET and the power switch, the amplifier circuit including an amplifier output circuit having an operating voltage, wherein the sampling MOSFET and the amplifier circuit are configured to convert the sampled current into a sampled voltage and provide the sampled voltage to the comparing circuit; and a clamping MOSFET operatively coupled in series with the sampling MOSFET and configured to clamp the operating voltage of the amplifier output circuit and an operating voltage of the comparing circuit; and wherein the comparing circuit is configured to compare the sampled voltage with a reference voltage, and to output a result of overcurrent detection according to the comparing.

2. The overcurrent detection circuit according to claim 1, wherein the power switch is an N-type MOSFET (NMOS) or a P-type MOSFET (PMOS).

3. The overcurrent detection circuit according to claim 1, wherein the clamping MOSFET is an NMOS.

4. The overcurrent detection circuit according to claim 1, wherein the sampling circuit includes the sampling MOSFET, the amplifier, the clamping MOSFET, a negative feedback controlling MOSFET, and a divider resistor;

wherein the sampling MOSFET and the power switch are connected in common-gate and common-drain configuration, with both gates connected to a first bias voltage, and both drains to an input voltage, a source of the sampling MOSFET is connected to a positive input of the amplifier and a drain of the clamping MOSFET;

wherein a source of the power switch is connected to a negative input of the amplifier, an output of the amplifier is connected to a gate of the negative feedback controlling MOSFET, a gate of the clamping MOSFET is connected to a second bias voltage, a source of the clamping MOSFET is connected to the divider resistor, one end of the divider resistor is connected to the source of the clamping MOSFET, a power terminal of a comparator and a reference resistor in the comparing circuit, another end of the divider resistor is connected to a drain of the negative feedback controlling MOSFET and a negative input of the comparator in the comparing circuit, and a source of the negative feedback controlling MOSFET is connected to ground; and wherein the comparing circuit comprises the reference resistor, a reference current source, and the comparator, a common end of the reference resistor and the reference current source is connected to a positive input of the comparator.

5. The overcurrent detection circuit according to claim 4, wherein the amplifier is connected in a negative feedback configuration and a virtual shorting effect at input terminals of the amplifier equalizes voltages at the positive and negative inputs of the amplifier;

wherein the sampling MOSFET samples a current passing through the power switch, wherein the current passing through the power switch is N times a current Is passing through the sampling MOSFET, wherein N is a positive integer;

wherein a current passing through the clamping MOSFET, the negative feedback controlling MOSFET, and the divider resistor is the current Is, and a voltage drop across the divider resistor is R1*Is, wherein R1 indicates a resistance of the divider resistor;

wherein the voltage drop across the reference resistor is R2*Ir wherein R2 indicates a resistance of the reference resistor, and Ir indicates a reference current supplied by the reference current source;

wherein a reference voltage input at the positive input of the comparator is a source voltage of the clamping MOSFET minus R2*Ir, the sample voltage input at the negative input of the comparator is the source voltage of the clamping MOSFET minus R1*Is;

wherein when the voltage drop across the divider resistor is less than the voltage drop across the reference resistor (R1*Is<R2*Ir), the sample voltage is greater than the reference voltage, an output signal of the comparator is low, indicating no overcurrent in the power switch; and wherein when the voltage drop across the divider resistor is greater than the voltage drop across the reference resistor (R1*Is>R2*Ir), the sample voltage is less than the reference voltage, the output signal of the comparator is high, indicating an overcurrent in the power switch.

6. The overcurrent detection circuit according to claim 4, wherein the source voltage of the clamping MOSFET is the operating voltage for both the comparing circuit and the output circuit of the amplifier that is formed by the negative feedback controlling MOSFET and the divider resistor; wherein the source voltage of the clamping MOSFET is the second bias voltage minus a gate-source voltage of the MOSFET; and wherein the second bias voltage is less than the input voltage.

7. The overcurrent detection circuit according to claim 1, wherein the sampling circuit includes the sampling MOSFET, the amplifier, a first clamping MOSFET, a second clamping MOSFET, a negative feedback controlling MOSFET, a divider resistor, and a mirroring MOSFET;

wherein the sampling MOSFET and the power switch are in common-gate and common-drain connection with both gates connected to a first bias voltage and both drains to an input voltage, a source of the sampling MOSFET is connected to a positive input of the amplifier and a drain of the first clamping MOSFET;

wherein a source of the power switch is connected to a negative input of the amplifier, an output of the amplifier is connected to a gate of the negative feedback controlling MOSFET, a gate of the first clamping MOSFET is connected to a second bias voltage, a source of the first clamping MOSFET is connected to a drain of the negative feedback controlling MOSFET, a drain of the second clamping MOSFET is connected to the input voltage, a gate of the second clamping MOSFET is connected to the second bias voltage, a source of the second clamping MOSFET is connected to the divider resistor, a power terminal of a comparator and a reference resistor in the comparing circuit, one end of the divider resistor is connected to the source of the second clamping MOSFET, the power terminal of the comparator and the reference resistor in the comparing circuit, another end of the divider resistor is connected to a drain of the mirroring MOSFET and a negative input of the comparator in the comparing circuit, the mirroring MOSFET and the negative feedback controlling MOSFET are in common-source and common-gate connection, with both sources connected to ground; and wherein the comparing circuit comprises the reference resistor, a reference current source, and the comparator, a common end of the reference resistor and the reference current source is connected to a positive input of the comparator.

8. The overcurrent detection circuit according to claim 7, wherein the amplifier is connected in a negative feedback configuration and a virtual shorting effect at input terminals of the amplifier equalizes voltages at the positive and negative inputs of the amplifier;
wherein the sampling MOSFET samples a current passing through the power switch, which is N times of a current passing through the sampling MOSFET, wherein N is a positive integer;
wherein a current passing through the first clamping MOSFET and the negative feedback controlling MOSFET is the current Is passing through the sampling MOSFET;
wherein the mirroring MOSFET mirrors the current Is of the negative feedback controlling MOSFET, and a voltage drop across the divider resistor is R1*Is, wherein R1 is a resistance of the divider resistor;
wherein the voltage drop across the reference resistor is R2*Ir, wherein R2 indicates a resistance of the reference resistor and Ir indicates a reference current supplied by the reference current source;
wherein the reference voltage input at the positive input of the comparator is the source voltage of the second clamping MOSFET minus R2*Ir, the sample voltage input at the negative input of the comparator is the source voltage of the second clamping MOSFET minus R1*Is; and
wherein when the voltage drop across the divider resistor is less than the voltage drop across the reference resistor (R1*Is<R2*Ir), the sample voltage is greater than the reference voltage, the output signal of the comparator is low, indicating no overcurrent in the power switch;
wherein when the voltage drop across the divider resistor is greater than the voltage drop across the reference resistor (R1*Is>R2*Ir), the sample voltage is less than the reference voltage, the output signal of the comparator is high, indicating an overcurrent in the power switch.

9. The overcurrent detection circuit according to claim 7, wherein the source voltage of the first clamping MOSFET is the operating voltage of the negative feedback controlling MOSFET; the source voltage of the second clamping MOSFET is the operating voltage of the divider resistor, the mirroring MOSFET, and the comparing circuit; wherein the source voltage of the first clamping MOSFET and the second clamping MOSFET is the second bias voltage minus a gate-source voltage; and wherein the second bias voltage is less than the input voltage.

10. The overcurrent detection circuit according to claim 1, wherein the amplifier comprises a first PMOS, a second PMOS, a third PMOS, a fourth PMOS, a fifth PMOS, a first reference current source, a second reference current source, a clamping diode, and a first NMOS;
wherein the first PMOS and the second PMOS form a current mirror stage, the third PMOS and the fourth PMOS form a serial stack type stage, a source of the first PMOS is a positive input to the amplifier, a gate of the first PMOS is connected to a drain of the first PMOS and to a gate of the second PMOS, a drain of the first PMOS is connected to a source of the third PMOS, a source of the second PMOS is a negative input to the amplifier, a drain of the second PMOS is connected to a negative electrode of the clamping diode and a source of the fourth PMOS, a gate of the third PMOS is connected to a drain of the third PMOS and to a gate of the fourth PMOS, a drain of the third PMOS is connected to the first reference current source, the gate of the fourth PMOS is also connected to a positive electrode of the clamping diode, a drain of the fourth PMOS is connected to a source of the fifth PMOS, the second reference current source, and the gate of the first NMOS, a gate of the fifth PMOS is connected to a clamping voltage, a drain of the fifth PMOS is connected to ground, the source of the first NMOS is connected to ground, and the drain of the first NMOS acts as an output of the amplifier and is connected to the third reference current source.

11. An overcurrent detection method for a power switch, comprising
performing, by a sampling circuit, current sampling of the power switch using a sampling MOSFET and an amplifier;
converting, by the sampling circuit, a sample current into a sample voltage;
transmitting, by the sampling circuit, the sample voltage to a comparing circuit;
clamping, by a serially connected clamping MOSFET, operating voltages of the comparing circuit and of an output circuit of the amplifier;
comparing, by the comparing circuit, the sample voltage with a reference voltage; and
outputting, by the comparing circuit, a result of overcurrent detection.

12. The overcurrent detection method according to claim 11, wherein the power switch is an N-type MOSFET (NMOS) or a P-type MOSFET (PMOS).

13. The overcurrent detection method according to claim 11, wherein the clamping MOSFET is an NMOS.

14. The overcurrent detection method according to claim 11,
wherein the sampling circuit includes the sampling MOSFET, the amplifier, the clamping MOSFET, a negative feedback controlling MOSFET, and a divider resistor;
wherein the clamping MOSFET and the divider resistor are serially connected on a negative feedback path of the amplifier; and
wherein a common end of the divider resistor and the negative feedback controlling MOSFET outputs a sample voltage.

15. The overcurrent detection method according to claim 11,
wherein the sampling circuit includes the sampling MOSFET, the amplifier, a first clamping MOSFET, a second clamping MOSFET, a negative feedback controlling MOSFET, a divider resistor, and a mirroring MOSFET;
wherein the first clamping MOSFET is serially connected on a negative feedback path of the amplifier, the second clamping MOSFET is serially connected on the operating voltage path of a circuit branch in which the divider resistor and the mirroring MOSFET are located, the mirroring MOSFET mirrors a current on the negative feedback controlling MOSFET, and a common end of the divider resistor and the mirroring MOSFET outputs a sample voltage.

16. The overcurrent detection method according to claim 11, wherein the amplifier has a structure in which the source of a PMOS of a current mirror serves as an input to the amplifier, and the gate voltage of an NMOS at the output is clamped by the PMOS.

* * * * *